United States Patent [19]

Grass

[11] 3,849,734

[45] Nov. 19, 1974

[54] SIGNAL PROCESSING APPARATUS

[75] Inventor: Robert W. Grass, Quincy, Mass.

[73] Assignee: Grass Instrument Company, Quincy, Mass.

[22] Filed: Sept. 29, 1970

[21] Appl. No.: 76,536

[52] U.S. Cl. .................... 330/30 D, 330/51, 330/69, 330/145, 330/149

[51] Int. Cl. .............................................. H03f 3/68

[58] Field of Search ......... 330/10, 11, 29, 35, 30 D, 330/51, 69, 134, 144, 145, 149; 307/240

[56] References Cited

UNITED STATES PATENTS

| | | | |
|---|---|---|---|
| 3,550,013 | 12/1970 | Gurol | 330/51 X |
| 3,569,852 | 3/1971 | Berkovits | 330/29 X |

OTHER PUBLICATIONS

Lohrey et al, "Bipolar Clamp Using Chopping and Transformer Techniques," IBM Technical Disclosure Bulletin, Vol. 10., No. 2, July 1967, pg. 167.

*Primary Examiner*—James B. Mullins
*Attorney, Agent, or Firm*—Kenway & Jenney

[57] ABSTRACT

In the signal processing apparatus disclosed herein, blocking of a high gain amplifier is minimized by selectively shunting the input terminals of the amplifier when the amplifier output signal passes outside of a preselected range.

2 Claims, 1 Drawing Figure

PATENTED NOV 19 1974
3,849,734
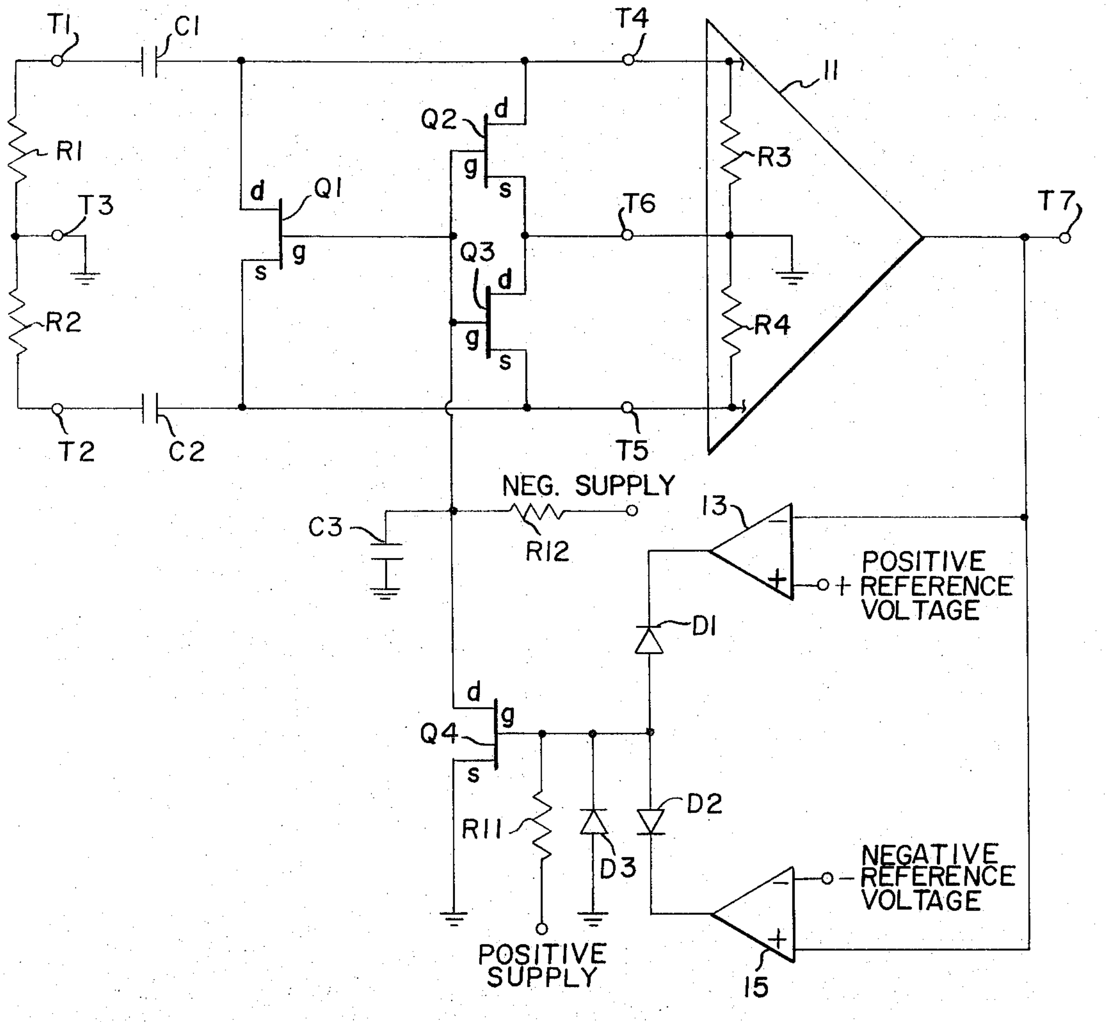
INVENTOR
ROBERT W. GRASS
BY
Kenway, Jenney & Hildreth
ATTORNEYS

SIGNAL PROCESSING APPARATUS

BACKGROUND OF THE INVENTION

In various situations, it is desirable to record or display a low level electrical signal which may include extraneous or unwanted low frequency components which are of relatively great amplitude. A particular example of such a situation is in electroencephalography (brainwave recording). As is understood, signals in the range of only a few microvolts may be of interest and thus relatively high amplification, e.g., a gain of about 100,000 will typically be necessary to bring the signals to a level suitable for recording or conventional display. However, since the source of these signals typically presents a relatively high source impedence and since the signals are obtained by leads and electrodes which may exhibit substantial extraneous signal pickup and varying contact potentials, it can often be expected that the actual input signal applied to the high gain amplifier may contain spurious low frequency and d.c. components which may be large in relation to the desired input signal. In the practice of electroencephalography, these extraneous signals are typically referred to as artifacts.

Since the high gain amplifiers typically employed for electroencephalography are usually a.c. coupled, low frequency components of relatively large amplitude can cause blocking of the amplifier. Such blocking can be due to the relatively long time constants required of the input and interstage coupling capacitors and/or due to rectification caused by overdriving the various amplifier stages. Separation of the wanted and unwanted signal components prior to application to the amplifier is typically not practical since components of the unwanted signals may differ in frequency from components of the desired signal by a factor of 10 or less. Further, as noted previously, the low frequency spurious signal components may be of greater amplitude than the desired signal components. Accordingly, differentiation on the basis of frequency is typically not feasible.

Among the several objects of the present invention may be noted the provision of signal processing apparatus in which low level signals are strongly amplified and blocking due to transitory overdriving is minimized; the provision of such apparatus which recovers quickly after being overdriven; the provision of such apparatus which does not distort signals applied thereto; the provision of such apparatus which is highly reliable; and the provision of such apparatus which is relatively simple and inexpensive.

Other objects and features will be in part apparent and in part pointed out hereinafter.

SUMMARY OF THE INVENTION

Briefly, signal processing apparatus according to the present invention employs an amplifier which has a pair of input terminals and which operates to provide an output signal which is a relatively highly amplified function of an input signal applied to the input terminals, the amplifier being subject to blocking when overdriven. A comparator means is provided for generating a switching signal when the output signal from the amplifier passes outside of a preselected range. The switching signal in turn controls appropriate switching means for selectively shunting the input terminals of the amplifier. Accordingly, blocking of the amplifier is minimized.

BRIEF DESCRIPTION OF THE DRAWING

The single figure is a partially schematic block diagram of signal processing apparatus constructed in accordance with the present invention.

DESCRIPTION OF THE PREFERRED EMBODIMENT

Referring now to the drawing, the apparatus illustrated there includes three input terminals T1, T2 and T3 to which EEG (electroencephalograph) electrodes may be connected. As is conventional, one of the electrodes (T3) is taken as local ground while the signal of interest is applied in a differential mode between the remaining terminals T1 and T2. The source impedance presented by the EEG electrodes when appropriately attached to a patient is represented by a pair of resistors R1 and R2.

A high gain amplifier is indicated at 11. As is conventional, amplifier 11 accepts input signals in a differential mode at a pair of input terminals T4 and T5 with respect to a neutral or ground terminal T6. For electroencephalographic purposes, the amplifier 11 preferably has a relatively high input impedance, this input impedance being represented in the drawing by a pair of resistors R3 and R4. Operating in the differential mode, the amplifier operates to provide at an output terminal T7 an output signal which is a highly amplified function of an input signal applied between the input terminals T4 and T5. The output signal provided is thus at a level appropriate for recording or display in conventional manner.

The a.c. components of EEG signals applied to the input terminals T1 and T2 are transmitted to the amplifier input terminals T4 and T5 through a pair of capacitors C1 and C2. In order to pass the lowest frequency signal components of interest, the capacitors C1 are preferably of relatively large value. As is understood, such a.c. coupling may cause the amplifier 11 to be overdriven and blocked in the presence of spurious d.c. or low frequency signals at the input. For example, if there is a d.c. shift at the input terminals T1 and T2, the time required for unblocking would normally be determined by the time constants of the capacitors C1 and C2 with the respective input resistors R1 and R2. Since the capacitors C1 and C2 are of relatively large value and the input impedance (R1, R2) of the amplifier 11 is also high, the amplifier will recover only relatively slowly following such a d.c. offset.

According to the practice of the present invention, the time to reach equilibrium following a d.c. shift or low frequency disturbance is reduced by automatically shunting the input terminals of the amplifier 11. Shunting is provided by means of a network of three N-channel field-effect transistors Q1, Q2 and Q3 which function as electrically controllable switching means. Transistor Q1 is connected so that its drain-source circuit directly shunts the amplifier input terminal T4 to the amplifier input T5, while transistors Q2 and Q3 are connected so that the drain-source circuit of each transistor shunts a respective one of the amplifier input terminals to ground. The gate terminals of the transistors Q1–Q3 are connected together for common control as described hereinafter.

The input shunting transistors Q1–Q3 are controlled in response to the output signal provided by the amplifier. The amplifier output signal is applied to the negative, i.e., inverting, input terminal of a first comparator amplifier 13 and to the positive, i.e., non-inverting, terminal of a second comparator amplifier 15. A positive reference voltage is applied to the positive input terminal of the first comparator amplifier 13 and a negative reference voltage is applied to the negative input terminal of the other comparator amplifier 15. Suitable positive and negative supply voltages (not shown) are also provided in conventional manner. The positive and negative reference voltages in effect define a preselected range of voltages for the amplifier output signal provided at terminal T7. The comparator amplifiers operate in conventional fashion, the amplifier 13 providing a negative-going logic signal whenever the amplifier output signal is more positive than the positive reference voltage and the comparator amplifier 15 providing a negative-going logic signal when the amplifier output signal is more negative than the negative reference voltage. The comparator amplifiers provide positive logic signals when the conditions described above are not met.

The logic signals provided by the two comparator amplifiers are combined by a pair of diodes D1 and D2 operating as an OR gate and the combined signal is applied to the gate terminal of a P-channel field-effect transistor Q4 which, as is described hereinafter, controls the amplifier input shunting transistors Q1–Q3. Transistor Q4 is normally biased into an off state by a positive supply voltage which is applied to its gate terminal through a resistor R11. However, when either of the comparator amplifiers 13 or 15 provides a negative-going logic signal, the respective diode D1 or D2 conducts and the gate-source circuit of transistor Q4 is forward biased, thereby turning the transistor on and permitting conduction through its drain-source circuit. The extent of forward biasing is limited by a diode D3.

The drain terminal of transistor Q4 is connected to the negative supply voltage through a resistor R12 and is connected also to the common junction of the gate terminals of the switching transistors Q1–Q3. A capacitor C3 connects this common junction to ground for slowing the response of the blocking control feedback loop, as described hereinafter.

During normal operation, i.e., in the absence of any extraneous or spurious signals which could cause blocking, the amplifier 11 operates in conventional fashion. The values of the positive and negative reference voltages are selected so that the amplifier output signal will stay in the range between these voltages during such normal operation. Thus, as long as the amplifier output voltage is within this range, both comparator amplifiers 13 and 15 will provide positive logic levels and the gate-source circuit of the transistor Q4 will remain positively biased so that the transistor Q4 is turned off and non-conducting through its drain-source circuit. Accordingly, the drain terminal of transistor Q4 together with the common junction of the gate terminals of the switching transistors Q1–Q3, will remain at a negative potential with respect to ground. The transistors Q1–Q3 will thus also be cut off or non-conducting.

As is understood by those skilled in the art, the drain-source circuit of a field-effect transistor appears as a substantially open circuit to small signals of either polarity when the transistor is cut off. Thus, the presence of the transistors Q1–Q3 when cut off will not substantially affect the operation of the input circuit of the amplifier 11. Accordingly, the input circuit time constant of the amplifier is then determined by the relative values of the a.c. coupling capacitors C1 and C2 and the input impedance of the amplifier (R3 and R4) and thus the amplifier will accept the low frequency components of the desired input signal.

If, on the other hand, there is a shift in the d.c. level of the input signal of a magnitude which could cause blocking, the output signal from the amplifier will move outside of its normal range and one or the other of the comparator amplifiers 13 and 15 will generate a negative-going logic signal. As noted previously, the negative-going logic signal is coupled to the gate terminal of transistor Q4, turning it on. When transistor Q4 is turned on, its drain terminal is pulled substantially to ground potential by conduction through the drain-source circuit and thus the positive bias voltage is substantially removed from the gate terminals of the transistors Q1–Q3, allowing them to conduct. When the transistors Q1–Q3 are thus allowed to conduct, their drain-source circuits present relatively low resistance paths shunting the input circuit of the amplifier 11. As is understood, the drain-source circuits of such transistors are essentially resistive and thus they will conduct small signals of either polarity when the transistors are in a conductive state. Accordingly, the time constant of the amplifier input circuit is then determined principally by the relative values of the capacitors C1 and C2 with the source impedance (resistors R1 and R2). It can thus be seen that the charge on the coupling capacitors C1 and C2 will reach equilibrium in a much shorter time than if the charge were supplied only by the very high input impedance of the amplifier 11 (R3 and R4). Accordingly, the time over which the amplifier is necessarily blocked is substantially reduced. The capacitor C3 slows the response of this control loop so that instability is prevented. In some systems, however, the slew rate of the amplifier 11 itself may be slow enough to allow the necessary settling of the input circuit prior to the return of the logic circuitry to its normal state.

If it is desired to further reduce the effective time constant of the a.c. coupling input circuit, a buffer amplifier stage may be interposed between the EEG electrodes and the any a.c. coupling capacitors. For example, another pair of field-effect transistors operated as source followers may be used to present a relatively low source impedance to the coupling capacitors C1 and C2 while presenting a relatively high input impedance to the EEG electrodes. Thus, when the switching transistors Q1–Q3 are turned on, the input circuit time constant will be relatively short even if there is an unusually high or variable subject/electrode resistance.

Since the present invention operates to establish a new equilibrium in response to excursions of the electroencephalographic amplifier output signal, it can be seen that this invention also prevents any overdriving or blocking in any intermediate stages in the amplifier 11 which may employ a.c. or capacitive interstage coupling.

In view of the foregoing, it may be seen that several objects of the present invention are achieved and other advantageous results have been attained.

As various changes could be made in the above construction without departing from the scope of the invention, it should be understood that all matter contained in the above description or shown in the accompanying drawings shall be interpreted as illustrative and not in a limiting sense.

What is claimed is:

1. Signal processing apparatus comprising:

a differential input amplifier having a pair of input terminals and being operative to provide an output signal which is a relatively highly amplified function of an input signal applied to said input terminals;

means, including at least one coupling capacitor, for applying an input signal to said input terminals;

comparator means responsive to the output signal from said amplifier for generating a switching signal when said output signal passes above a first preselected level or below a second preselected level; and switching means controlled by said switching signal for selectively shunting said input terminals, said switching means including at least one field-effect transistor, the drain-source circuit of which is connected across said input terminals, said switching means further including a respective field-effect transistor for each of said input terminals, the drain-source circuits of each of said respective transistor being connected between the respective input terminal and ground, whereby blocking of said amplifier by low frequency signals is minimized.

2. Apparatus as set forth in claim 1 wherein said switching signal is applied to the gate terminals of said transistors.

* * * * *